US006304201B1

(12) United States Patent
Moreland et al.

(10) Patent No.: US 6,304,201 B1
(45) Date of Patent: Oct. 16, 2001

(54) PRECISION DIGITAL-TO-ANALOG CONVERTERS AND METHODS HAVING PROGRAMMABLE TRIM ADJUSTMENTS

(75) Inventors: Carl W. Moreland, Oak Ridge; Russel G. Stop, Winston-Salem, both of NC (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/489,955

(22) Filed: Jan. 24, 2000

(51) Int. Cl.[7] .............................. H03M 1/10; H03M 1/78
(52) U.S. Cl. ............................................ 341/154; 341/121
(58) Field of Search ................................... 341/154, 118, 341/120, 121, 144, 172; 323/313

(56) References Cited

U.S. PATENT DOCUMENTS

| | | | |
|---|---|---|---|
| 4,138,671 | * | 2/1979 | Comer et al. ........................ 341/121 |
| 4,150,366 | * | 4/1979 | Price ..................................... 341/121 |
| 4,338,590 | * | 7/1982 | Connolly et al. .................... 341/121 |
| 4,851,838 | * | 7/1989 | Shier .................................... 341/121 |
| 5,218,362 | * | 6/1993 | Mayes et al. ........................ 341/121 |
| 5,440,305 | * | 8/1995 | Signore et al. ..................... 341/120 |
| 5,642,116 |   | 6/1997 | Gersbach . |
| 5,923,209 |   | 7/1999 | Price et al. . |

OTHER PUBLICATIONS

Sheingold, David H. (edited by),*Analog–Digital Conversion Handbook*, Prentice Hall, Englewood Cliffs, New Jersey, 1986, pp. 298, 306.

* cited by examiner

Primary Examiner—Patrick Wamsley
(74) Attorney, Agent, or Firm—Koppel & Jacobs

(57) ABSTRACT

N-bit precision digital-to-analog converters are provided that facilitate realization of precision linearities (i.e., linearities that substantially exceed N-bit linearity). They include a binary-weighted current source, current switches and bidirectional-trim digital-to-analog converters. The binary-weighted current source generates binary-weighted currents that are each coupled to the output port by a respective one of the current switches in response to a respective bit of the digital input signal. The bidirectional-trim digital-to-analog converters generate respective bidirectional trim currents with respective amplitudes and directions. Each of the bidirectional-trim digital-to-analog converters is coupled to provide its bidirectional trim current to a respective one of the current switches for a linearizing adjustment of that switch's binary-weighted current. Preferably, the bidirectional-trim currents are slaved to the binary-weighted currents.

12 Claims, 5 Drawing Sheets

PRECISION DIGITAL-TO-ANALOG CONVERTERS AND METHODS HAVING PROGRAMMABLE TRIM ADJUSTMENTS

BACKGROUND OF THE INVENTION

1. Field of the Invention

The present invention relates generally to digital-to-analog converters (DACs) and more particularly to precision DACs.

2. Description of the Related Art

Digital-to-analog converters convert a digital input signal into an analog output signal. This process is exemplified in the graph 20 of FIG. 1 which illustrates output signals for each digital code of a 3-bit digital input signal. The analog response signals are shown as vertical analog columns whose heights represent portions of the converter's full scale output. For example, the digital input code 011 is associated with a vertical column 22 whose analog amplitude is ⅜ of the DAC's full scale output.

If a DAC has an absence of conversion error, all of the vertical columns of the graph 20 will have exactly the correct height so that their upper tips fall on a line 24 that is the locus of an error-free output because it connects the zero and full scale analog points. The line 24 is thus the locus of ideal DAC conversion.

Practical DACs, however, do generate errors in their converted analog output. The 000 vertical column of FIG. 1, for example, may have a non-zero height and the upper tips of the vertical analog columns may then lie on a locus line 26 that is spaced from the error-free locus line 24. The locus line 26 exemplifies an offset error. In contrast, a DAC gain error is exemplified by a condition in which the tips of the vertical columns lie on a locus line 28 that begins at zero but has a slope which causes it to have a full scale error.

In many DAC applications, offset and gain errors can be compensated. A more critical error is nonlinearity which is typically defined in terms of integral nonlinearity and differential nonlinearity. Integral nonlinearity is a measure of the maximum deviation from the error-free line 24 and is exemplified by the exemplary locus envelopes 30 in FIG. 1.

Differential linearity refers to the analog linearity exhibited by adjacent digital input codes. Full scale analog output divided by the number of bits yields the analog measure of one least-significant bit (LSB) as shown in FIG. 1. If first and second adjacent digital bits have plus and minus errors of ½ LSB, then the analog output signal does not change between these digital codes. If the error is any greater between these adjacent digital bits, the analog signal declines as the second bit succeeds the first bit. The conversion is then said to be non-monotonic.

Although it is sufficient in many DAC applications to have a nonlinearity that does not exceed ½ LSB, other applications require precision DACs in which nonlinearity is substantially reduced from ½ LSB. An exemplary application is that of a subranging analog-to-digital converter (ADC) system in which conversion to a coarse set of digital bits is achieved in an initial ADC stage and an analog residue is formed and "pipelined" to subsequent ADC stages for further conversion.

In particular, the initial ADC converts an analog input signal into an initial set of digital bits. In response to this initial set, an initial DAC generates a converted analog signal which is subtracted from the input analog signal to form an analog residue signal which is then passed (pipelined) to a subsequent ADC.

If the subsequent ADC is not the final ADC, the foregoing process is repeated. That is, a subsequent DAC generates another converted analog signal which is again subtracted from the analog signal to form another analog residue signal which is pipelined to the following stage. The final ADC converts its respective residue signal into a final set of digital bits.

The conversion into the final set of digital bits cannot be more linear than the preceding conversion processes. If it is desired, for example, to realize a 12-bit subranging ADC with initial, subsequent and final 4-bit conversion stages, the initial 4-bit DAC must have 12-bit linearity and the subsequent 4-bit DAC must have 8-bit linearity.

Processing techniques and controls (e.g., statistical process matching) are typically employed to approach these precision DAC linearities but they generally must be supplemented by a one-time physical trim and/or a power-up calibration method. The time and cost associated with these latter processes would be substantially reduced with DACs that included a high-linearity programmable adjustment structure.

SUMMARY OF THE INVENTION

The present invention is directed to precision N-bit DACs that include programmable and bidirectional trim adjustments which facilitate realization of precision linearities (i.e., linearities that substantially exceed N-bit linearity).

In a precision digital-to-analog converter that converts a digital input signal into an analog signal at an output port, these goals are realized with a binary-weighted current source, current switches and bidirectional-trim digital-to-analog converters. The binary-weighted current source generates binary-weighted currents that are each coupled to the output port by a respective one of the current switches in response to a respective bit of the digital input signal.

In response to respective internal digital codes, the bidirectional-trim digital-to-analog converters generate respective bidirectional trim currents with respective amplitudes and directions. Each of the bidirectional-trim digital-to-analog converters is coupled to provide its bidirectional trim current to a respective one of the current switches for a linearizing adjustment of that switch's binary-weighted current.

Preferably, the bidirectional-trim currents are slaved to the binary-weighted currents. In an embodiment of the invention, this is realized with a current divider that has a divider input and a divider output. One of the binary-weighted currents is coupled to the divider input and trim current sources in each of the bidirectional-trim digital-to-analog converters are coupled to the divider output.

A subranging ADC is illustrated to be an exemplary application of the precision DACs of the invention.

The novel features of the invention are set forth with particularity in the appended claims. The invention will be best understood from the following description when read in conjunction with the accompanying drawings.

DETAILED DESCRIPTION OF THE EMBODIMENTS

Figure 2:
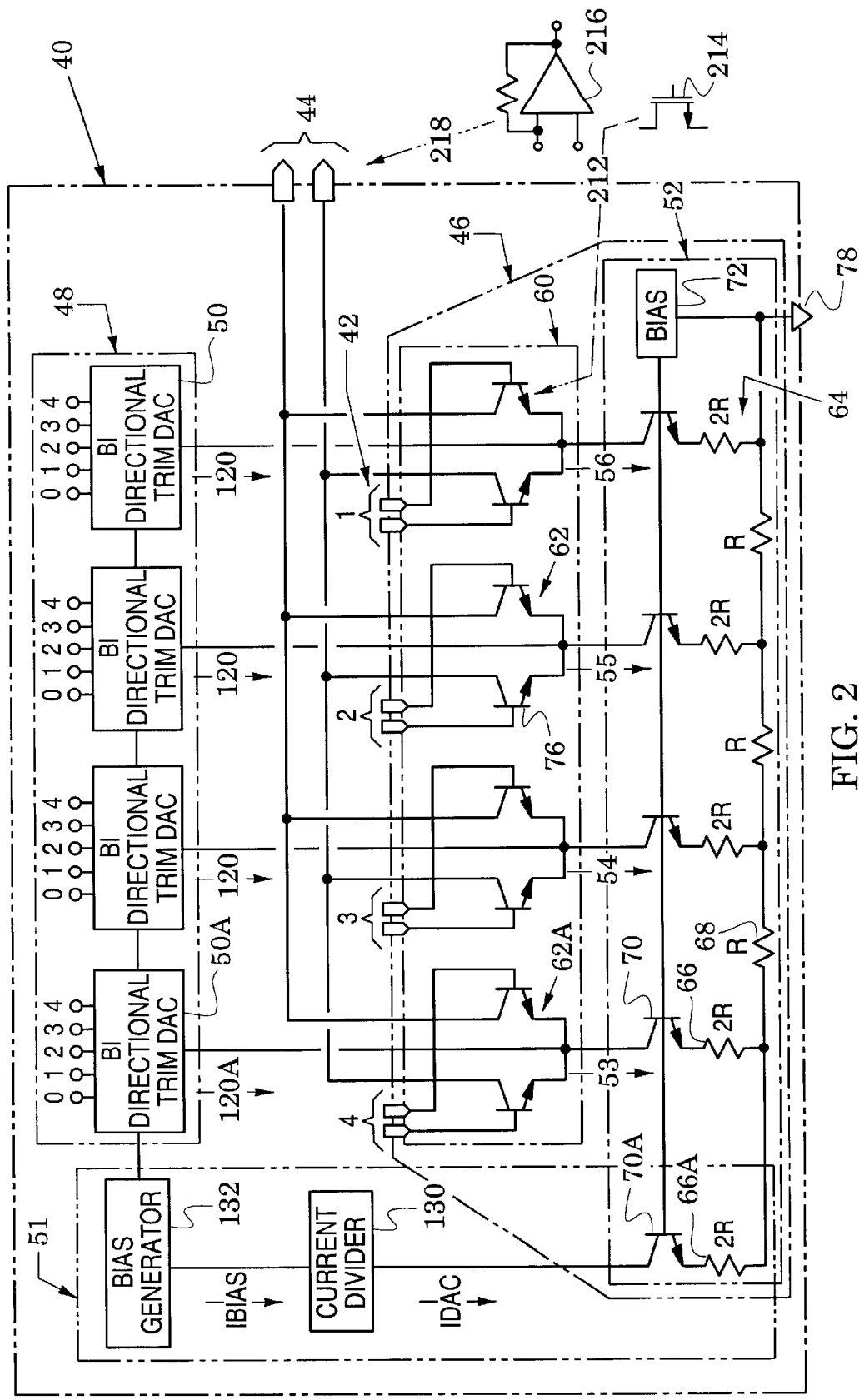
FIG. 2 is a schematic of a precision digital-to-analog converter system embodiment of the present invention.

The schematic of FIG. 2 illustrates an embodiment of a precision DAC system 40 which converts a digital signal at an input port 42 into an analog signal at a differential output port 44. The DAC system 40 includes a primary DAC 46, a set 48 of bidirectional trim DACs 50 and a current coupler 51 that controls current relationships between the primary DAC 46 and the bidirectional trim DACs 50.

The system exemplified in FIG. 2 thus supplements a 4-bit primary DAC 46 with bidirectional trim DACs 50 that can be programmed to correct errors and achieve linearities in the DAC system 40 that are substantially greater than that of a conventional 4-bit linearity. A further investigation of this linearization process is facilitated by preceding it with the following structural description of the DAC system 40.

The primary DAC 46 has a binary-weighted current source 52 that generates binary-weighted currents 53, 54, 55 and 56. The primary DAC 46 also has a set 60 of current switches 62 that couple respective binary-weighted currents to the output port 44 in response to respective bits of the digital signal at the input port 42.

The binary-weighted current source 52 is formed with an R-2R resistive ladder 64 having first ends of 2R-value resistors 66 connected by R-value resistors 68. Bias transistors 70 have respective first current terminals (emitters) coupled to second ends of respective 2R-value resistors 66 and have their control terminals (bases) coupled to a voltage bias source 72.

Preferably, the current switches 62 are differential pairs of transistors 76 wherein each differential pair is coupled between the differential output port 44 and a second current terminal (collector) of a respective one of the bias transistors 70. The control terminals of each differential pair are differentially coupled to form a respective bit input of the digital input port 42.

In accordance with a characteristic of R-2R resistive ladder structures, the ladder impedance presented to the left-hand terminal of each R-value resistor 68 is substantially R. Accordingly, voltages are halved as currents flow through the R-value resistors to the ground reference 78. Because the emitters of the bias transistors 70 have a common potential, the currents 53, 54, 55 and 56 are binary-weighted (i.e., the current through one 2R-value resistor 66 is twice that through an adjacent 2R-value resistor 66 that is further from the ground reference 78).

In operation of the primary DAC 46, each current switch 62 differentially steers a respective one of the binary-weighted currents (53–56) to the differential output port 44 in response to a respective digital bit at the input port 42. In FIG. 2, each of the numbers 1–4 of the input port 42 indicate respective differential bit inputs and also designate an identifying number of the bit applied. A bit applied at bit input 1 is the most significant bit (MSB) and a bit applied at bit input 4 is the LSB. If current 53 has a magnitude I, for example, the currents 54, 55 and 56 has respective magnitudes 2I, 4I and 8I.

Figure 3:
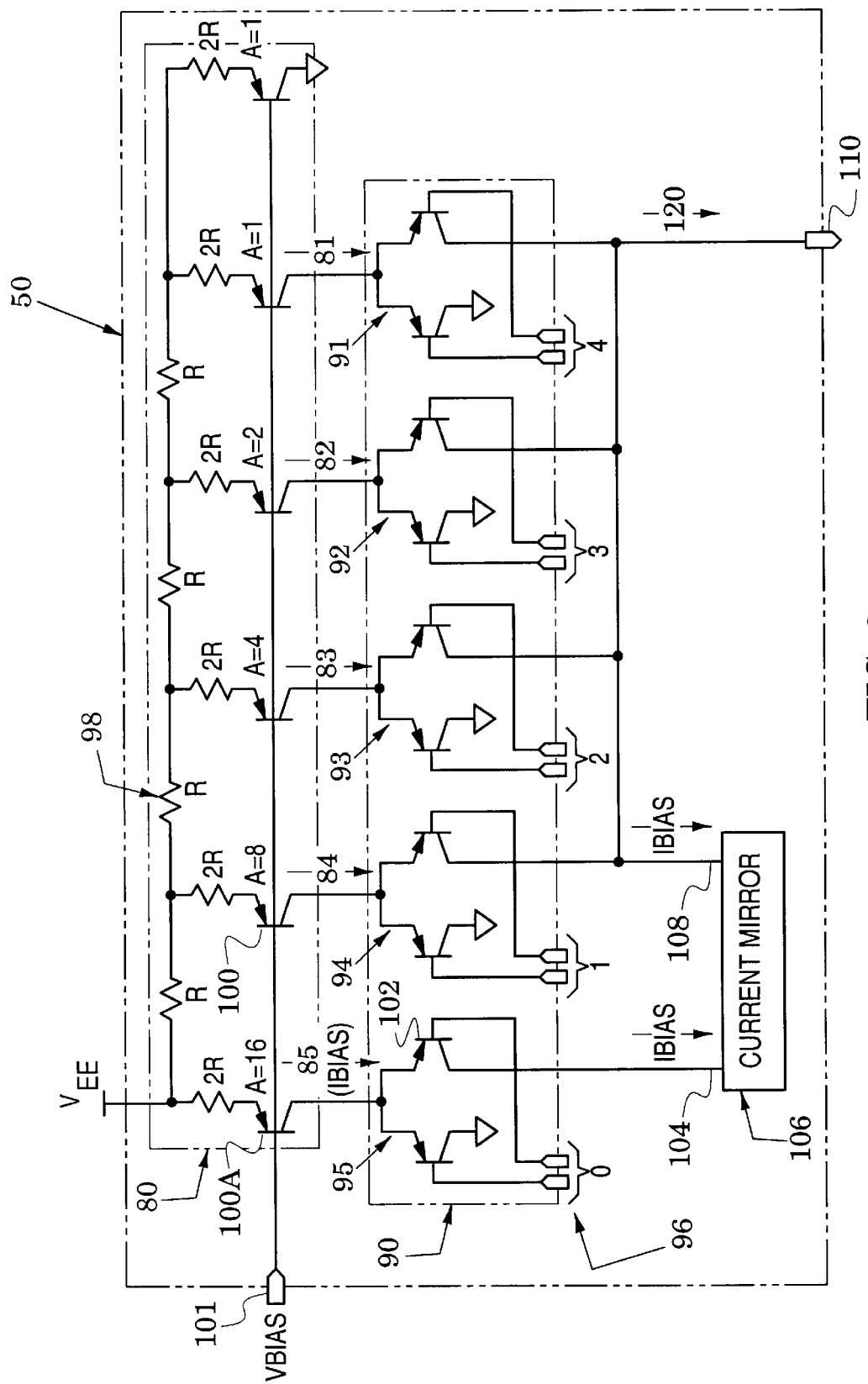
FIG. 3 is a schematic of a bidirectional-trim digital-to-analog converter in the converter system of FIG. 2.

An exemplary bidirectional trim DAC 50 is detailed in FIG. 3. Similar to the primary DAC 46 (of FIG. 2), the bidirectional trim DAC 50 has a binary-weighted trim current source 80 that generates binary-weighted trim currents 81, 82, 83, 84 and 85. It also has a set 90 of trim current switches 91, 92, 93, 94 and 95 that each steer a respective one of the trim currents in response to a respective digital bit at a trim input port 96 (which is internal to the DAC system (40 in FIG. 2).

The binary-weighted trim current source 80 is formed with an R-2R resistive trim ladder 98 that is coupled through trim bias transistors 100 whose bases are biased with a common potential VBIAS from a bias port 101. Because the R-2R resistive trim ladder 98 doubles voltages in a manner similar to that previously described and because the trim bias transistor emitters have a common potential, the trim currents 81, 82, 83, 84 and 85 are binary-weighted.

The current switches 91–95 are preferably realized with differential pairs of transistors 102 whose control terminals are differentially coupled to form a respective bit input of the trim input port 96. The numbers 0–4 of the trim input port 96 indicate respective differential bit inputs and also designate an identifying number of the bit applied. A bit applied at bit input 0 is the most significant bit (MSB) and a bit applied at bit input 4 is the LSB. If trim current 81 has a magnitude I, for example, trim currents 82, 83, 84 and 85 respectively have magnitudes 2I, 4I, 8I and 16I.

The MSB trim current switch 95 responds to bit 0 by differentially steering trim current 81 to a first port 104 of a current mirror 106. The trim current switches 94–91 respectively respond to bits 1–4 by differentially steering respective trim currents 82–85 to a second port 108 of the current mirror 106 which is also joined to a trim output port 110 of the bidirectional trim DAC 50.

The bias potential VBIAS at the bases of the trim bias transistors 100 can be supplied by a stable voltage source. Preferably, however, the trim currents of the binary-weighted trim current source 80 are slaved to the currents of the binary-weighted current source 52 of FIG. 2. Thus as process variations cause binary-weighted currents in the primary DAC 46 to increase and decrease from unit to unit, the binary-weighted currents in the bidirectional trim DAC 50 will correspondingly increase and decrease and maintain fixed relationships between all binary-weighted currents.

This current-slaving control is supplied by the current coupler 51 which, as shown in FIG. 2, combines a bias transistor 70A in the binary-weighted current source 52 with a current divider 130 and a bias generator 132. The emitter of the bias transistor 70A is coupled to the final 2R-value resistor 66A of the R-2R ladder 64 and its base is coupled to the bases of the other bias transistors 70. It thus carries a current IDAC which equals the LSB current 53.

Figure 4:
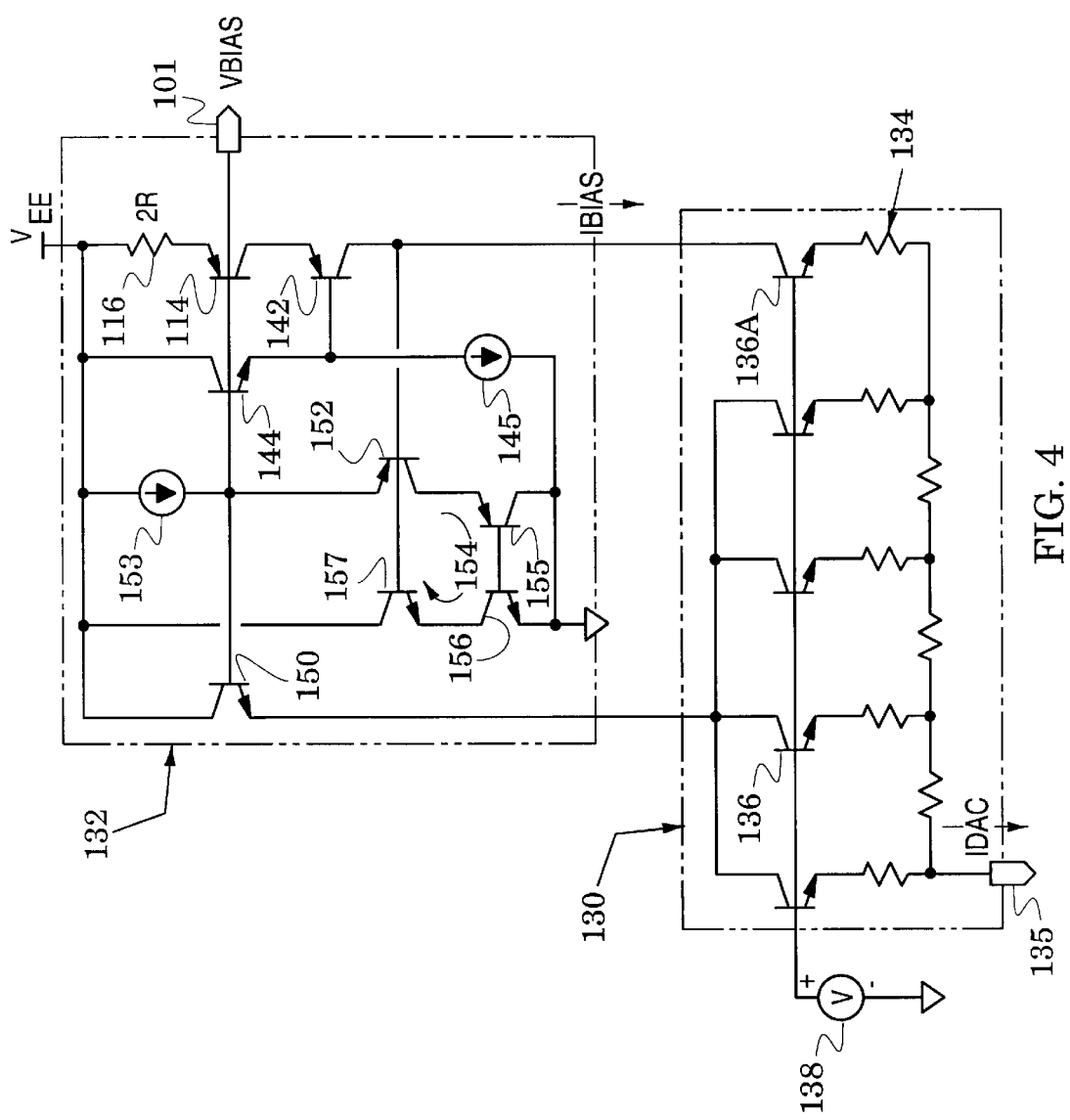
FIG. 4 is a schematic of a current coupler in the converter system of FIG. 2.

An embodiment of the current divider 130 and the bias generator 132 is shown in FIG. 4. Initially, it is helpful to ignore the divider and note that the bias generator includes a mirror transistor 114 which has its emitter coupled to VEE through a 2R-value resistor 116 which is an impedance copy of the 2R-value resistors of the R-2R resistive trim ladder 98 of FIG. 3. The base of the mirror transistor 114 is coupled to a bias port 101 which is the same as the bias port 101 of the bidirectional trim DAC 50 of FIG. 3. Accordingly, the base bias of the mirror transistor 114 is the same as that of trim bias transistors 100 of FIG. 3.

If the current divider 130 is temporally ignored, the mirror transistor 114 and its associated resistor are seen to form an active load for the bias transistor 70A of FIG. 2. In this case, the current IDAC would therefore flow through the mirror transistor 114 and this current IDAC would be mirrored to the first trim bias transistor 100A of the binary-weighted trim current source 80 of FIG. 3.

It is therefore apparent that the current divider 130 of FIGS. 2 and 3 reduces this current IDAC to a divided current IBIAS which flows through the mirror transistor 114 (the currents IBIAS and IDAC are also shown in FIG. 2). Because this current is mirrored to the first trim bias transistor 100A of FIG. 3, a current IBIAS is switched through the trim current switch 95 and into the first port 104 of the current mirror 106. The current mirror then causes a current IBIAS to flow into its second port 108.

As described above, the trim currents 81, 82, 83, 84 and 85 of FIG. 3 are binary-weighted so that the trim currents 81, 82, 83 and 84 have amplitudes respectively of IBIAS/16, IBIAS/8, IBIAS/4 and IBIAS/2. When the current switch 95 steers the current IBIAS away from the current mirror 106, a trim current 120 at the trim output port 110 can be programmed to have any positive combination of IBIAS/16, IBIAS/8, IBIAS/4 and IBIAS/2 (wherein positive direction is that of the current arrow 120 at the output port 110). When the current switch 95 steers the current IBIAS to the current mirror 106, the trim current 120 at the trim output port 110 can be programmed to have any negative combination of IBIAS/16, IBIAS/8, IBIAS/4 and IBIAS/2.

In summary, the bidirectional trim DAC 50 can deliver a bidirectional trim current 120 that is formed by any positive and negative combination of IBIAS/16, IBIAS/8, IBIAS/4 and IBIAS/2 and IBIAS can be set by the current divider 130 to be any division of IDAC which is, in turn, the MSB of the primary DAC 46 of FIG. 2. Finally, the current divider 130 divides IDAC to fix a slaved value for IBIAS. It is apparent that the bidirectional trim DAC can supply trim currents over a range of ±IBIAS with a resolution of IBIAS/16 and further apparent that the bidirectional trim currents are slaved to the binary-weighted currents 53–56 of the primary DAC 46 of FIG. 2.

Preferably, the emitter areas of the trim bias transistors 100 are scaled in accordance with the current that they carry. This area scaling is indicated in FIG. 3 by the designations "A=1", "A=2" and so on to "A=16" that are adjacent to the trim bias transistors. This scaling tends to equalize heating effects to thereby reduce variations in thermal voltage $V_T$ and base-emitter voltages in the trim bias transistors. Similar emitter area scaling is perferably employed in the binary-weighted current source 52 of FIG. 2.

An embodiment of the current divider 130 is shown in FIG. 4 in which it is configured with a binary-weighted current source that is formed with an R-2R resistive ladder 134 which is coupled between an IDAC current port 135 and bias transistors 136. The bases of these transistors are biased by a voltage source 138 and the current port 135 is coupled to the collector of the bias transistor 70A of FIG. 2.

Accordingly, the collectors of these bias transistors can be coupled to cause IBIAS to have any combination of IDAC/8, IDAC/4, IDAC/2 and IDAC. As configured in FIG. 4, IBIAS is equal to IDAC/8 because the mirror transistor 114 in the bias generator 132 is coupled to the collector of the bias transistor 136A at the end of the ladder 134 and the other bias transistor collectors are joined and commonly biased (i.e., in this particular current division, the bias transistor 136A is "used" and the other bias transistors are "unused").

The trim of the precision DAC system 40 of FIG. 2 is degraded by any nonlinearities or drifts in the R-2R resistive trim ladder 98 of FIG. 3, the current divider 130 and the bias generator 132 of FIG. 4. Errors associated with the ladders are reduced by statistical matching methods. For example, devices associated with the ladders are sufficiently sized, similarly oriented and are restricted to a small common area of the integrated-circuit die.

As to the bias generator, it includes the following linearizing circuits. It is apparent that the current switch 95 of the bidirectional trim DAC 50 of FIG. 3 introduces an α error (via an α loss between emitter and collector of transistor 102) in the current that it steers to the first port 104 of the current mirror 106. Accordingly, the bias generator 132 of FIG. 4 couples a compensation transistor 142 between its mirror transistor 114 and the current divider 130.

The compensation transistor 142 introduces a compensating α gain so that the current into the current mirror 106 precisely matches the IBIAS from the current divider 130. In a similar manner, the compensation transistor 142 compensates α losses in the other current switches 91, 92, 93 and 94 of the bidirectional trim DAC 50. Transistor 144 and current source 145 are coupled to bias the base of the compensation transistor 142.

Bootstrap transistor 150 has its collector connected to $V_{EE}$, its base connected to receive VBIAS and its emitter coupled to the joined collectors of the bias transistors 136 of the current divider 130. Accordingly, it reduces divider errors in the current divider 130 by reducing differences between the collector-base voltage of the "unused" bias transistors 136 and the collector-base voltage of the "used" bias transistor 136A.

Transistor 152 is coupled between IBIAS line and the VBIAS line to function as an emitter follower that supplies base current to the trim bias transistors (100 in FIG. 3). However, the base current of emitter follower transistor 152 disturbs the one-to-one relationship between the IBIAS current in the collector of bias transistor 136A and the IBIAS current that enters the first port 104 of the current mirror 106 of FIG. 3. This relationship is returned by a feedback loop 154 through compensation transistors 155, 156 and 157 which subtracts a compensating base current from the base of bootstrap transistor 152.

With the structure of the bidirectional trim DAC 50 of FIG. 3 and the current divider 130 and bias generator 132 of FIG. 4 described, attention is now directed to operation of the precision DAC system 40 of FIG. 2.

Figure 1:
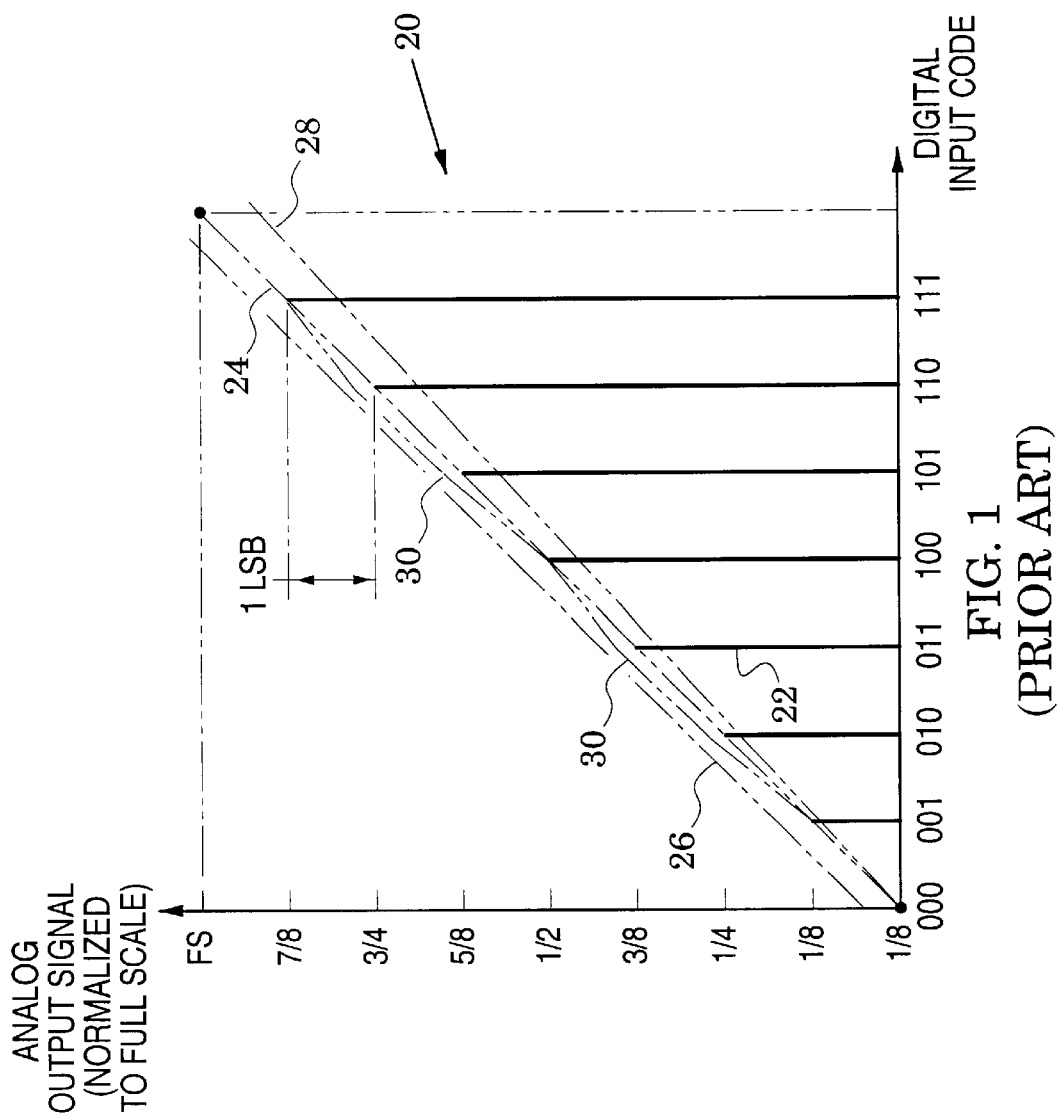
FIG. 1 is a graph that illustrates conversion relationships in an exemplary 3-bit digital-to-analog converter.

When each of the current switches 62 of FIG. 1 are individually switched, they should deliver a respective binary-weighted output current that is scaled in accordance with its respective digital bit. In response to the LSB current switch 62A, for example, a differential LSB current will appear at the output port 44. This differential current may have a positive or negative direction error and have a particular error magnitude.

Appropriate differential signals are then applied at the internal port (96 in FIG. 3) of the bidirectional trim DAC 50A of FIG. 2 to realize a correction current 120A whose direction is selected to correct the direction error and whose amplitude is selected to correct the amplitude error (to within the resolution of the LSB current of the bidirectional trim DAC).

The differential signals at the internal port (96 in FIG. 3) are generated and set by internal circuits (e.g., latches) of the bidirectional trim DAC. This process of correcting current direction and amplitude errors is repeated as each of the other current switches 62 of FIG. 2 is activated in turn.

Figure 5:
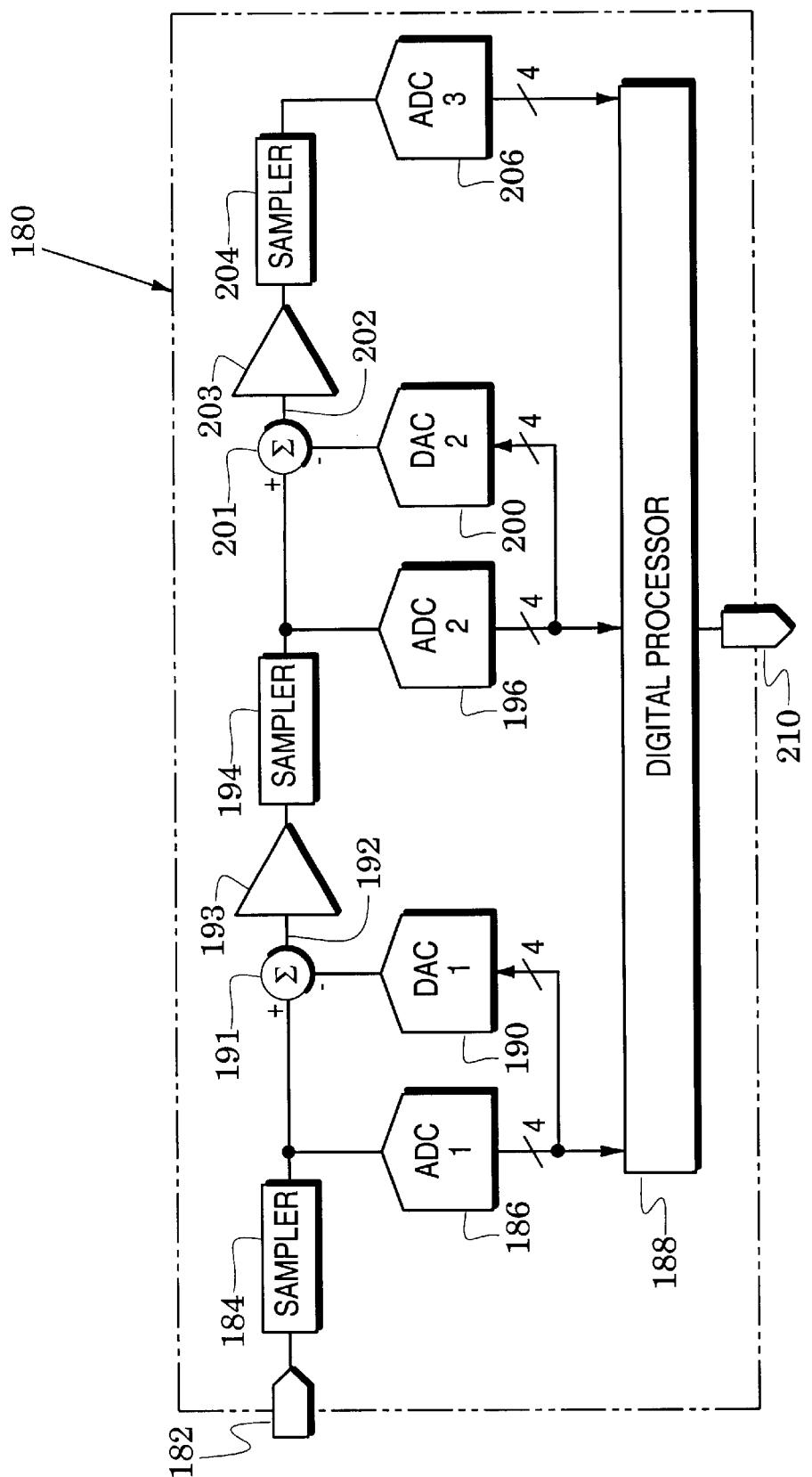
FIG. 5 is a block diagram of a subranging analog-to-digital converter that includes the converter system of FIG. 2.

An exemplary application of the precision DAC system 40 of FIG. 2 is illustrated in the subranging ADC 180 of FIG. 5. This ADC receives analog signals at an input port 182 where they are sampled by an initial sampler 184. The sampled input is converted in an initial ADC 186 to an initial set of digital bits which are delivered to a digital processor 188.

An initial DAC 190 then converts the initial set of digital bits to a converted analog signal which is subtracted from the sampled input in a differencer 191 to form an initial residue signal 192. Because this action results in an amplitude reduction, the initial residue signal is preferably "gained up" in an amplifier 193 and then sampled in a subsequent sampler 194.

The initial conversion process is then repeated. That is, the sampled residue signal is converted in a subsequent ADC 196 to a subsequent set of digital bits which are delivered to the digital processor 188. A subsequent DAC 200 then converts the subsequent set of digital bits to a converted analog signal which is subtracted from the sampled residue signal in a differencer 201 to form a subsequent residue signal 202.

The subsequent residue signal passes through another amplifier 203 and is sampled in a final sampler 204. A final ADC 206 converts the sampled subsequent residue signal into a final set of digital bits which are combined in the digital processor 188 with the initial and subsequent sets of digital bits to form the final digital output signal at an output port 210. In subranging ADCs, the initial, subsequent and final ADCs are typically realized as serial arrangements of single bit ADCs (e.g., folding amplifiers).

In an exemplary 12-bit conversion embodiment, the initial ADC and DAC are 4-bit devices, the subsequent ADC and DAC are 4-bit devices and the final ADC is also a 4-bit device. In another conversion embodiment, the second and third ADCs may be structured to realize an extra digital bit. This extra conversion range is used in conjunction with error correction logic in the digital processor 188 to correct the output signal for most of the errors inherent in the subranging structure.

In either of these exemplary embodiments, the final ADC must have 4-bit linearity for the subranging ADC to be linear to an LSB/2. In the subsequent and initial conversion stages, however, an LSB/2 error respectively requires 8-bit and 12-bit linearity. Thus, the subsequent and initial DACs are required to be 4-bit devices that can convert with 8-bit and 12-bit linearity respectively. Preferably, therefore, the DACs 190 and 200 are realized with structure that is exemplified by the DAC system 40 of FIG. 2.

The invention has been described with the aid of bipolar transistor embodiments. However the teachings of the invention may be practiced with any transistor structure (e.g., CMOS) which has first and second current terminals controlled by signals at a control terminal. An exemplary CMOS substitution is indicated by substitution arrow 212 and CMOS transistor 214 in FIG. 2.

Although the output signals of the ADC 40 of FIG. 2 have been illustrated and described as current signals, the teachings of the invention can also be applied to realize voltage output signals. For example, the output currents in FIG. 2 may be directed into a current-to-voltage amplifier 216 which is inserted at the output port 44 as indicated by insertion arrow 218.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A precision digital-to-analog converter that converts a digital input signal into an analog signal at an output port, comprising:

a binary-weighted resistive-ladder primary current source that generates binary-weighted primary currents;

primary current switches which each selectively couple a respective one of said binary-weighted primary currents to said output port in response to a respective bit of said digital input signal;

a current coupler that mirrors one of said binary-weighted primary currents to thereby generate a binarily-related most-significant-bit trim current;

at least one binary-weighted resistive-ladder trim current source that receives said most-significant-bit trim current and, in response, generates binary-weighted trim currents;

a current mirror that selectively mirrors and combines said most-significant-bit trim current with said binary-weighted trim currents to thereby selectively reverse their direction; and trim current switches which each selectively couple a respective one of said binary-weighted trim currents to one of said primary current switches for a linearizing adjustment of that switch's binary-weighted primary current.

2. The digital-to-analog converter of claim 1, wherein said current coupler includes:

an R-2R resistive coupler ladder comprised of R-value resistors and 2R-value resistors;

coupler bias transistors that have their control ports coupled together to receive a common bias voltage and that each have a first current port coupled to a respective one of said 2R-value resistors; and a current mirror that mirrors the current in a second current port of one of said coupler bias transistors to thereby provide said most-significant-bit trim current.

3. The digital-to-analog converter of claim 1, wherein said binary-weighted resistive-ladder primary current source includes:

an R-2R resistive primary ladder comprised of R-value resistors and 2R-value resistors; and primary bias transistors that have their control ports coupled together to receive a common bias voltage and that each have a first current port coupled to a respective one of said 2R-value resistors;

and wherein said primary current switches each comprise a differential pair of transistors that is coupled between said output port and a second current port of a respective one of said bias transistors.

4. The digital-to-analog converter of claim 1, wherein said binary-weighted resistive-ladder trim current source includes:

an R-b 2R resistive trim ladder comprised of R-value trim resistors and 2R-value trim resistors; and trim bias transistors that have their control ports coupled together to receive a common bias voltage and that each have a first current port coupled to a respective one of said 2R-value trim resistors;

and wherein said trim current switches each comprise a differential pair of transistors that is coupled between a second current port of a respective one of said trim bias transistors and one of said primary current switches.

5. A subranging analog-to-digital converter system that converts an analog input signal to a corresponding digital output signal, comprising:

an initial analog-to-digital converter that converts said analog input signal to an initial set of digital bits of said digital output signal;

a precision digital-to-analog converter that converts said respective set of digital bits to a converted analog signal at a converter output and subtracts said converted analog signal from said analog input signal to form an analog residue signal; and a final analog-to-digital converter that converts said analog residue signal to a final set of digital bits of said digital output signal;

wherein said precision digital-to-analog converter includes:
  a) a binary-weighted resistive-ladder primary current source that generates binary-weighted primary currents;
  b) primary current switches which each selectively couple a respective one of said binary-weighted primary currents to said converter output in response to a respective bit of said initial set of digital bits;
  c) a current coupler that mirrors one of said binary-weighted primary currents to thereby generate a binarily-related most-significant-bit trim current:
  d) at least one binary-weighted resistive-ladder trim current source that receives said most-significant-bit trim current and, in response, generates binary-weighted trim currents;
  e) a current mirror that selectively mirrors and combines said most-significant-bit trim currents with said binary-weighted trim currents to thereby selectively reverse their direction; and
  trim current switches which each selectively couple a respective one of said binary-weighted trim currents to one of said primary current switches for a linearizing adjustment of that switch's binary-weighted primary current.

6. The converter system of claim 5, wherein said current coupler includes:
  an R-2R resistive coupler ladder comprised of R-value resistors and 2R-value resistors;
  coupler bias transistors that have their control ports coupled together to receive a common bias voltage and that each have a first current port coupled to a respective one of said 2R-value resistors; and
  a current mirror that mirrors the current in a second current port of one of said coupler bias transistors to thereby provide said most-significant-bit trim current.

7. The converter system of claim 5 wherein said binary-weighted primary current source includes:
  an R-2R resistive primary ladder comprised of R-value resistors and 2R-value resistors; and
  primary bias transistors that have their control ports coupled together to receive a common bias voltage and that each have a first current port coupled to a respective one of said 2R-value resistors;
  and wherein said primary current switches each comprise a differential pair of transistors that is coupled between said output port and a second current port of a respective one of said bias transistors.

8. The converter system of claim 5, wherein said binary-weighted trim current source includes:
  an R-2R resistive trim ladder comprised of R-value trim resistors and 2R-value trim resistors; and
  trim bias transistors that have their control ports coupled together to receive a common bias voltage and that each have a first current port coupled to a respective one of said 2R-value trim resistors;
  and wherein said trim current switches each comprise a differential pair of transistors that is coupled between a second current port of a respective one of said trim bias transistors and one of said primary current switches.

9. A precision digital-to-analog converter that converts a digital input signal into an analog signal at an output port, comprising:
  a binary-weighted resistive-ladder primary current source that generates binary-weighted primary currents;
  primary current switches which each include a primary differential pair of transistors that selectively couples a respective one of said binary-weighted primary currents to said output port in response to a respective bit of said digital input signal;
  a current coupler that mirrors one of said binary-weighted primary currents to thereby generate a binarily-related most-significant-bit trim current;
  at least one binary-weighted resistive-ladder trim current source that receives said most-significant-bit trim current and, in response, generates binary-weighted trim currents;
  a current mirror that selectively mirrors and combines said most-significant-bit trim current with said binary-weighted trim currents to thereby selectively reverse their direction; and
  trim current switches which each include a trim differential pair of transistors that selectively couples a respective one of said binary-weighted trim currents to one of said primary current switches for a linearizing adjustment of that switch's binary-weighted primary current.

10. The digital-to-analog converter of claim 9, wherein said current coupler includes:
  an R-2R resistive coupler ladder comprised of R-value resistors and 2R-value resistors;
  coupler bias transistors that have their control ports coupled together to receive a common bias voltage and that each have a first current port coupled to a respective one of said 2R-value resistors; and
  a current mirror that mirrors the current in a second current port of one of said coupler bias transistors to thereby provide said most-significant-bit trim current.

11. The digital-to-analog converter of claim 9, wherein said binary-weighted primary current source includes:
  an R-2R resistive primary ladder comprised of R-value resistors and 2R-value resistors; and
  primary bias transistors that have their control ports coupled together to receive a common bias voltage and that each have a first current port coupled to a respective one of said 2R-value resistors;
  and wherein said primary current switches each comprise a differential pair of transistors that is coupled between said output port and a second current port of a respective one of said bias transistors.

12. The digital-to-analog converter of claim 9, wherein said binary-weighted trim current source includes:
  an R-2R resistive trim ladder comprised of R-value trim resistors and 2R-value trim resistors; and
  trim bias transistors that have their control ports coupled together to receive a common bias voltage and that each have a first current port coupled to a respective one of said 2R-value trim resistors;
  and wherein said trim current switches each comprise a differential pair of transistors that is coupled between a second current port of a respective one of said trim bias transistors and one of said primary current switches.

* * * * *